United States Patent
Feiweier et al.

(10) Patent No.: US 11,914,014 B2
(45) Date of Patent: Feb. 27, 2024

(54) METHOD AND SYSTEM FOR IMPROVING THE CONTRAST OF MAGNETIZATION-TRANSFER-PREPARED MRI

(71) Applicant: Siemens Healthcare GmbH, Erlangen (DE)

(72) Inventors: Thorsten Feiweier, Bavaria (DE); Tom Hilbert, Lausanne (CH); Bryan Clifford, Malden, MA (US)

(73) Assignee: Siemens Healthineers AG, Forchheim (DE)

( * ) Notice: Subject to any disclaimer, the term of this patent is extended or adjusted under 35 U.S.C. 154(b) by 43 days.

(21) Appl. No.: 17/708,357

(22) Filed: Mar. 30, 2022

(65) Prior Publication Data

US 2022/0317218 A1    Oct. 6, 2022

Related U.S. Application Data

(60) Provisional application No. 63/167,835, filed on Mar. 30, 2021.

(51) Int. Cl.
*G01R 33/56* (2006.01)
*G01R 33/483* (2006.01)

(52) U.S. Cl.
CPC ..... *G01R 33/5602* (2013.01); *G01R 33/4835* (2013.01)

(58) Field of Classification Search
None
See application file for complete search history.

(56) References Cited

U.S. PATENT DOCUMENTS

| | | | |
|---|---|---|---|
| 9,846,212 B2 | 12/2017 | Paul et al. | |
| 2007/0080685 A1* | 4/2007 | Bydder | G01R 33/4816 324/309 |
| 2019/0137585 A1* | 5/2019 | Bornert | G01R 33/56341 |
| 2022/0187401 A1 | 6/2022 | Feiweier et al. | |
| 2023/0132314 A1* | 4/2023 | Rehwald | G01R 33/4835 324/309 |

OTHER PUBLICATIONS

R.M. Henkelman et al: "Review Article: Magnetization transfer in MRI: a review" NMR in Biomedicine, NMR Biomed. 2001; 14, 57-64, received Feb. 18, 2000; revised Oct. 13, 2000, accepted Oct. 20, 2000; 2000.

(Continued)

*Primary Examiner* — Rodney E Fuller
(74) *Attorney, Agent, or Firm* — Banner & Witcoff Ltd.

(57) ABSTRACT

In a method for improving the contrast of magnetization-transfer-prepared magnetic resonance imaging (MRI), an acquisition scheme comprising a plurality of inversion-recovery (IR)-imaging modules in an interleaved arrangement is selected, a number of magnetization-transfer (MT)-preparation modules is selected, a pulse sequence is generated by arranging at least one MT-preparation module of the number of MT-preparation modules between two successive IR-preparation modules of the interleaved IR-imaging modules or in front of the first IR-preparation module of a group of interleaved IR-imaging modules, and the pulse sequence for an MRI examination is applied or saved. Each IR-imaging module may include an IR-preparation module and a slice acquisition module.

17 Claims, 3 Drawing Sheets

(56) References Cited

OTHER PUBLICATIONS

Raja, A. et. al., "Radiology Utilization in the Emergency Department: Trends of the last Two Decades", AJR Am J Roentgenol, 203(2): 355-360, doi:10.2214/AJR.13.11892, 2014.
Melki P. et. al., "Magnetization Transfer Effects in Multislice RARE Sequences", Magnetic Resonance in Medicine 24, pp. 189-195, 1992.

* cited by examiner

METHOD AND SYSTEM FOR IMPROVING THE CONTRAST OF MAGNETIZATION-TRANSFER-PREPARED MRI

CROSS REFERENCE TO RELATED APPLICATIONS

This patent application claims priority to, and the benefit of, U.S. Provisional Patent Application No. 63/167,835, filed Mar. 30, 2021, which is incorporated herein by reference in its entirety.

BACKGROUND

Field

The disclosure describes a method and a system for improving the contrast of magnetization-transfer-prepared MRI (MRI: magnetic resonance imaging system). Since one goal of the disclosure is the creation of a pulse sequence and a pulse sequence is able to control a magnetic resonance imaging system (MRI-system), it also describes a method and a system for controlling an MRI-system.

Related Art

The relevance of MR imaging for clinical diagnosis is strongly linked to the versatility of available contrast-generating mechanisms. The impact of magnetization transfer (MT) effects on standard MR imaging procedures is well known (see Melki and Mulkern "Magnetization Transfer Effects in Multislice RARE Sequence", Magn. Reson. Med. 24:189; 1992). For example, each spatially selective RF-pulse which gets applied "on-resonance" from the perspective of spins in a desired slice location will (partially) excite bound water protons in the surrounding volume (i.e. outside the desired slice location). Thus, multi-slice imaging experiments with multiple spatially selective RF-pulses will often show tissue contrast with additional contributions from MT effects.

Given the rather long acquisition time and potentially high levels of the specific absorption rate (SAR) of e.g. turbo spin echo (TSE) acquisitions, there is the need for alternative imaging techniques that can provide similar contrast in less time. Echoplanar imaging (single-shot ss-EPI or multi-shot techniques ms-EPI) allows fast acquisition of T2-FLAIR images, with a flexible trade-off between acquisition speed and image quality. This is highly desirable in applications which are time-critical, e.g. MRI in an emergency room (ER), which is one of the fastest growing sectors in MR (see e.g. A. S. Raja et al.: "Radiology Utilization in the Emergency Department: Trends of the Past 2 Decades," Am. J. Roentgen., 203: 355-360; 2014).

Compared to TSE imaging, echoplanar imaging usually exhibits less MT contributions in its image contrast due to its smaller number of applied RF-pulses. Additional RF-pulses which get applied in dedicated "MT-preparation modules" can help to establish the desired contrast. Technically, an MT-preparation module can be rather simple: it contains a single, off-resonance, non-selective RF-pulse with a high amplitude.

Typically, a Gaussian pulse shape is used which provides a reasonable compromise between spectral selectivity and required RF power (see e.g. Henkelman et al.: "Magnetization Transfer in MRI: a Review", NMR in Biomed. 14:57; 2001).

The frequency offset of the pulse is selected such that a decent excitation of bound water protons is obtained while still avoiding an excitation of the "on-resonant" protons to be imaged.

For the diagnosis of white matter lesions (e.g. Multiple Sclerosis), T2-FLAIR images with contributions from MT effects are often preferred by radiologists due to their clear depiction of conspicuous regions. The attenuation of signal components from fluids is obtained by applying an inversion-recovery (IR) preparation module, and by starting the signal acquisition after an inversion time TI which is determined by the zero-crossing of the fluid signal. An IR sequence is simply an imaging module, e.g. a spin-echo (SE) sequence, preceded at time TI by a 180° inverting pulse.

To save acquisition time, the IR-preparations and corresponding signal acquisitions for multiple sub-volumes (e.g. multiple slices or multiple slabs) may get applied in an interleaved manner After successively inverting the MR signal in several sub-volumes, a corresponding number of data acquisition modules (e.g. one shot of a multi-shot EPI acquisition) is used for sampling the imaging data.

However, when using both, an IR-preparation and a MT-preparation module, it turns out that images which are generated from MR signals acquired with the first sampling intervals are lacking the desired MT contrast.

In the state of the art, when MT-preparation modules are required for a desired contrast and/or enabled by a user, they get applied immediately before each imaging module. Since the MT-preparation is spatially non-selective, it acts on the complete imaging volume: if multiple sub-volumes get successively acquired, each (spatially selective) acquisition is preceded by a (spatially non-selective) preparation module. After a short period of time, the magnetization evolution establishes a steady state which yields a similar contrast for all sub-volumes.

U.S. Pat. No. 9,846,212 B2 describes a technique that uses a continuous application of saturation modules to improve the suppression of signal components from undesired spin species (e.g. fat signal contributions). It uses a frequency-selective RF-pulse which saturates the chemically shifted spins of an undesired species such that they do not contribute to the succeeding image acquisition.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to improve the known systems, devices and methods to facilitate an improvement of the contrast of magnetization-transfer-prepared MRI, and especially to control a magnetic resonance imaging system, respectively.

Concerning the disclosure, the inventors realized that the observed contrast inhomogeneity of MR-images is a result of an interrupted evolution of the MT-related steady state. Thus, the goal of the inventors was to maintain the MT-related steady state (or at least to reduce its interruption by long blocks of IR-preparation modules), while still enabling a fast, interleaved data acquisition. This is achieved by adding MT-preparation modules into an IR-preparation "block" as described in the following. By trying to keep the time interval between successive MT-preparation modules similar throughout the scan, all data gets sampled with a comparable amount of MT-contrast.

A method according to an exemplary embodiment of the disclosure for improving the contrast of magnetization-transfer-prepared MRI, respectively for controlling a magnetic resonance imaging system, comprises the following steps:

selecting an acquisition scheme comprising a plurality of IR-imaging modules in an interleaved arrangement, wherein each IR-imaging module comprises an IR-preparation module and a slice acquisition module, selecting a number of MT-preparation modules, generating a pulse sequence by arranging at least one MT-preparation module of the number of MT-preparation modules between two successive IR-preparation modules of the interleaved IR-imaging modules or in front of the first IR-preparation module of the interleaved IR-imaging modules, applying or saving the pulse sequence for an MRI examination.

General acquisition schemes comprising a plurality of IR-imaging modules in an interleaved arrangement are well known in the art. These acquisition schemes contain IR-imaging modules, and these IR-imaging modules in turn are typically comprised of an IR-preparation module followed by a slice acquisition module after a certain inversion time. It is well known that an IR-preparation module performs a (magnetization) "excitation", wherein this is often referred to as an "inversion" (of magnetization). A slice acquisition module is used to actually acquire the MRI-data. Each slice acquisition module has its own RF-pulses which take care of exciting the magnetization used for slice imaging purposes.

Since the inversion time is often quite long (e.g. several hundreds up to several thousands of milliseconds), an interleaved scheme of a plurality of IR-imaging modules (i.e. interleaved IR-preparation modules and slice acquisition modules) is often applied in order to speed up an examination. In the following, such interleaved IR-imaging modules may be imagined as interleaved IR-preparation modules followed by interleaved slice acquisition modules (i.e. IR-preparation modules and slice acquisition modules are separated and not interleaved).

It should be noted that these interleaved IR-imaging modules do not need to be present in a pulse sequence already. They do not even need to consist of actual pulses. For the method according to the disclosure, only the knowledge about what interleaved arrangement of which IR-imaging modules (what pulses) should be applied is necessary. However, a predefined pulse sequence with a predefined arrangement of interleaved IR-imaging modules could preferably be used for the method.

Parallel to (or before/after) the selection of the acquisition scheme, a number of MT-preparation modules is selected. This could be only one single MT-preparation module or multiple MT-preparation modules. Each MT-preparation module may be comprised of a number of single RF-pulses. These RF-pulses may each be the same or they may be different pulses. For example, each MT-preparation module may consist of one single RF-pulse, wherein frequency, amplitude and duration of the RF-pulse may be varied to form different MT-preparation modules. However, it is also possible to select complex arrangements of pulses or pulses with complex pulse shapes as MT-preparation modules.

For the general method it is only necessary to "know" what modules should be used for the acquisition scheme and the MT-preparation modules that should be applied. Technically, data concerning the acquisition scheme and MT-preparation modules could be stored in a memory and retrieved after it is clear which examination should be performed next.

After the acquisition scheme and MT-preparation modules are selected, a pulse sequence is generated. How this is generally achieved, is well known in the art, i.e. by arranging the suitable components on the correct time-positions in a pulse sequence that could be used to control coils of a MRI-system.

It should be noted that, in fact, a pulse sequence comprises a complex arrangement of components, e.g. RF pulses, gradient pulses and data acquisition intervals. However, the disclosure pertains to the special insertion of additional MT-preparation modules into a (generally known) pulse sequence. Thus, it should be held in mind that the resulting pulse sequence comprises all necessary components for MR imaging, although these components are not explicitly mentioned.

However, in difference to the prior art, there is now an MT-preparation module arranged between two successive IR-preparation modules of the interleaved IR-imaging modules or in front of the first IR-preparation module of a group of interleaved IR-imaging modules. Thus, after this arrangement, there is at least one MT-preparation module in the pulse sequence that should be applied just before a succeeding IR-preparation module.

It should be noted that in this description expressions like "in front of," "before," "after," or "following" when speaking about MT-preparation modules means that there is no other module arranged between. Thus, these expressions mean "directly in front of," "directly before," "directly after," or "directly following."

When the special pulse sequence is generated, it is applied for an MRI examination or saved, e.g. for a later MRI examination.

A system according to the disclosure for controlling a magnetic resonance imaging system, especially with a method according to one of the preceding claims, comprises the following components:
- a selector configured for selecting a number of MT-preparation modules and an acquisition scheme comprising a plurality of IR-imaging modules in an interleaved arrangement, wherein each IR-imaging module comprises an IR-preparation module and a slice acquisition module,
- a sequencer configured for generating a pulse sequence by arranging at least one MT-preparation module of the number of MT-preparation modules between two successive IR-preparation modules of the interleaved IR-imaging modules or in front of the first IR-preparation module of a group of interleaved IR-imaging modules,
- a data interface configured to send the pulse sequence to a memory device or an application device,
- preferably a radio-frequency transmission device configured for applying the pulse sequence in a magnetic resonance imaging system.

As already indicated above, a pulse sequence typically comprises more components than RF-pulses only, e.g. gradient pulses. Thus, a gradient generator will typically be required in praxis as well (however not necessarily in the system according to the disclosure). However, since the disclosure concentrates on the MT-preparation modules, the RF transmission device plays the crucial role. The general MRI system of course comprises all necessary further units that are needed for MR imaging.

The disclosure is advantageously directed to the application of additional MT-preparation modules in front of or between successive IR-preparation modules in an interleaved acquisition scheme in order to establish a similar MT-related steady state (and thus similar MT-related contrast properties) for (all) acquired sub-volumes.

A controller according to the disclosure for controlling a magnetic resonance imaging system comprises a system according to the disclosure. Alternatively, or additionally, the controller is configured to perform the method according to the disclosure. The controller may comprise additional units or devices for controlling components of a magnetic resonance imaging system, e.g. a sequence controller for measurement sequence control, a memory, a radio-frequency transmission device that generates, amplifies and transmits RF pulses, a gradient system interface, a radio-frequency reception device to acquire magnetic resonance signals and/or a reconstructor to reconstruct magnetic resonance image data.

A magnetic resonance imaging system comprises a controller according to the disclosure.

Some units or modules of the system mentioned above can be completely or partially realized as software modules running on a processor of a respective computing system, e.g. of a controller of a magnetic resonance imaging system. A realization largely in the form of software modules can have the advantage that applications already installed on an existing computing system can be updated, with relatively little effort, to install and run these units of the present application. In one or more embodiments, the units or modules additionally or alternatively include processing circuitry that is configured to perform the respective functions of the units or modules. An object of the disclosure is also achieved by a computer program product with a computer program that is directly loadable into the memory of a computing system, and which comprises program units to perform the steps of the inventive method, at least those steps that could be executed by a computer, when the program is executed by the computing system. These are especially all steps, however, regarding an application of the pulse sequence, parts of this application that cannot be performed by a computer (e.g. emitting the magnetic fields) are not part of the program, wherein in turn the output of data that directs other units to output fields is preferably part of the program. In addition to the computer program, such a computer program product can also comprise further parts such as documentation and/or additional components, also hardware components such as a hardware key (dongle etc.) to facilitate access to the software.

A computer readable medium such as a memory stick, a hard-disk or other transportable or permanently-installed carrier can serve to transport and/or to store the executable parts of the computer program product so that these can be read from a processor of a computing system. A processor can comprise one or more microprocessors or their equivalents. Particularly advantageous embodiments and features of the disclosure are revealed in the following description. Features of different embodiments may be combined as appropriate to give further embodiments not described herein.

According to exemplary method, at least two MT-preparation modules of the number of MT-preparation modules are arranged between and/or in front of the successive IR-preparation modules of interleaved IR-imaging modules such that there is a block of multiple alternating IR-preparation modules and MT-preparation modules. In an exemplary embodiment, this block comprises two, three or more IR-preparation modules. In an exemplary embodiment, between every two IR-preparation modules of interleaved IR-imaging modules (said block), especially as well as in front of the first IR-preparation module, there is arranged a MT-preparation module.

According to an exemplary method, the IR-imaging modules are arranged in the form of a slice-interleaved imaging acquisition procedure, wherein there are MT-preparation modules in front of slice acquisition modules of the plurality of IR-imaging modules, especially in front of every slice acquisition module. In an arrangement according to an exemplary embodiment, the MT-preparation modules in front of the slice acquisition modules are identical to the MT-preparation modules in front of the IR-preparation modules, but do not have to be.

According to an exemplary method, properties of the MT-preparation modules arranged in the pulse sequence are varied (so that different MT-preparation modules comprise different properties), such as concerning an amplitude and/or a frequency offset. This variation especially concerns an absolute value (concerning amplitude and/or frequency) and/or polarity (concerning frequency) of a pulse of the respective MT-preparation modules. Thus, rather than using the same MT-preparation module throughout the measurement, it is possible to vary certain properties of the non-selective RF-pulses (of different MT-preparation modules). Depending on the characteristics of the magnetization transfer process (e.g. inhomogeneous MT), this will allow shaping the strength of MT-related contrast properties.

According to an exemplary method, a specific variation pattern of the MT-preparation modules that is used for slice acquisition modules, is also used for IR-preparation modules. This enhances the imaging properties.

According to an exemplary method, a specific variation pattern of MT-preparation modules in an IR imaging module is also used in another IR imaging module in the pulse sequence.

It should be noted, that a pulse sequence comprises several "blocks" of IR imaging modules that are applied as a sequence (together with a number of included MT-preparation modules). A plurality of these "blocks" (especially each block) may be provided with MT-preparation modules according to the disclosure. This could be done in an identical manner (MT-preparation modules of the blocks are identical) or in a non-identical manner (MT-preparation modules of the blocks differ from block to block). Also, other patterns are possible, e.g. alternating or increasing/decreasing patterns.

According to an exemplary method, the amplitude of MT-preparation-modules is reduced towards the end of a block of interleaved slice acquisition modules, such as in the form of a continuous reduction or in the form of a fixed reduction. In an exemplary embodiment, a continuous reduction is a linear or exponential reduction. In an exemplary embodiment, a fixed reduction is based on a step-function. In an exemplary embodiment, the number of modules with reduced amplitude is specified by a user, determined heuristically, or calculated based on the time constant of the decay of desired MT-related contrast. The reduction of amplitudes is advantageous for reduction of SAR and RF power demand. In an exemplary embodiment, a reduction of the last N of M MT-preparation modules (with N<M) in each acquisition block is performed.

According to an exemplary method, amplitudes of MT-preparation modules between the IR-preparation modules are adapted such that a steady state of MT-related contrast properties is obtained. In an exemplary embodiment, amplitudes of MT-preparation modules are calculated automatically based on assumptions about relaxation times, fractional spin pool sizes, and/or exchange rates of two spin pools. These spin-pools may e.g. be water spin pools or semi-solid pools. Essentially, this embodiment depends on time constants (e.g. how long does it take to establish an MT-related steady state?), the number of IR-preparation modules (or IS modules) and their respective duration. If the latter is short and the former long, one could face a situation where it makes sense to continue adapting the MT-modules applied between IR-preparation modules. This is another advantageous possibility to reduce SAR and RF power demand. In an exemplary embodiment, the adaption of the amplitudes of MT-preparation RF-pulses in between the IR-modules is done to obtain the steady state of MT-related contrast properties "just in time" before acquiring the first slice.

According to an exemplary method, at least two succeeding MT-preparation modules are arranged in front of an IR-preparation module. This means that there is a combined MT-preparation module inserted. This special method comprising the (additional) steps:

selecting (at least) two initial MT-preparation modules, determining a combined MT-module from the two MT-preparation modules, by choosing a time-offset comprising a relative application time-shift and also a phase-shift between the two MT-preparation modules, wherein this time-offset is chosen such that the two MT-preparation modules overlap, including the combined MT-module in the pulse sequence.

The selected initial MT-preparation modules have a predefined pulse shape (also designated as "envelope") and a predefined frequency. An initial MT-preparation module should have an amplitude that is below a maximum capacity of the MR-scanner, a finite duration, and should excite a single predefined frequency band. There could be several MT-preparation modules with different frequencies to excite different bands.

The combined MT module is generated from the initial MT-preparation modules by choosing a time-offset (relative application time-shift and also a phase-shift) between initial MT-preparation modules, wherein this time-offset is chosen such that the initial MT-preparation modules overlap. The relative application time-shift in the time-offset determines the temporal overlap of the initial MT-preparation modules. The time-offset should not be chosen arbitrarily, since the MT-preparation modules temporally shifted by the time-offset must overlap. That means that the time-offset must be smaller than the duration of the shifted MT-preparation modules, or in other words: the time-offset between two initial MT-preparation modules is such that the (especially all) initial MT-preparation modules are arranged such that there is always a temporal overlap of the initial MT-preparation modules having a non-empty set of time points where an RF-contribution of both initial MT-preparation modules is non-zero. In short: "overlap" means that there is no time gap between the initial MT-preparation modules or, respectively, that an MT-preparation module is applied before the preceding MT-preparation module ends.

The present disclosure is not only advantageous for amplitude modulated MT-preparation modules, but also for frequency or phase modulated MT-preparation modules (with complex-valued envelopes).

According to an exemplary method, at least two of the initial MT-preparation modules (e.g. RF-pulses) have a different frequency. In an exemplary embodiment, the difference between the frequencies of the pulses is more than 50 Hz. In an exemplary embodiment, two initial MT-preparation modules have separate (non-overlapping) frequency bands. This means that the difference between the frequencies is larger than the sum of the half bandwidth of either pulse. Thus, different initial MT-preparation modules may have different frequency offsets, where the frequency offset depends on the pulse shape.

It is clear that when applying more than two initial MT-preparation modules, it is possible (and depending on the case preferred) to use more than two different off-resonance frequencies. While this changes the frequency spectrum, it allows an even higher compression, without overlapping sub-pulses with identical frequency offset.

According to an exemplary method, the time-offset is chosen such that an absolute value of a maximum of the combined MT-module does not exceed a predefined maximum RF-intensity (the absolute value of the maximum amplitude) being lower than the maximum applicable RF-intensity of the magnetic resonance imaging system. In an exemplary embodiment, the absolute value of the maximum RF intensity of the combined MT-module is not exceeding the absolute value of a maximum RF-intensity of the initial MT-preparation modules.

According to an exemplary method, the pulse shape and/or the duration of a number of initial MT-preparation modules is identical. In an exemplary embodiment, these initial MT-preparation modules have different frequency offsets. The support of the pulse t0 is defined as the set of time points for which the pulse takes on non-zero values. The center of this set would be defined as the average of the maximum and minimum times in the support. Concerning the duration, t0 lies right in its center.

According to an exemplary method, two initial MT-preparation modules are arranged such that there is always a temporal overlap of the initial MT-preparation modules having a non-empty set of time points where an RF-contribution of both initial MT-preparation modules is non-zero. This means that there is always a region where non-zero contributions of MT-preparation modules are added. In other words, there is always a non-empty set of time points common to the support of each MT-preparation module, where the "support" of an MT-preparation module is the set of time points for which that pulse takes on non-zero-values.

According to an exemplary method, the time-offset is chosen such that a minimal temporal shift between two initial MT-preparation modules is determined. In an exemplary embodiment, the absolute value of a maximum of the combined MT-module does not exceed the predefined maximum RF-intensity.

According to an exemplary system, the sequencer is configured to include varied MT-preparation modules in the pulse sequence and/or to determine a combined MT-module as described above.

In a system according to an exemplary embodiment of the disclosure, components of the system are part of a data-network. In an exemplary embodiment, the data-network comprises parts of the internet and/or a cloud-based computing system, where the system according to the disclosure or a number of components of this system is realized in this cloud-based computing system. For example, the components of the system are part of a data-network, wherein the data-network and a medical imaging system which provides the image data are in communication with each other. Such a networked solution could be implemented via an internet platform and/or in a cloud-based computing system.

The method may also include elements of "cloud computing". In the technical field of "cloud computing", an IT infrastructure is provided over a data-network, e.g. a storage space or processing power and/or application software. The communication between the user and the "cloud" is achieved by means of data interfaces and/or data transmission protocols.

In the context of "cloud computing," in a method according to an exemplary embodiment of the disclosure, a provision of data via a data channel (for example a data-network) to a "cloud" takes place. This "cloud" includes a (remote) computing system, e.g. a computer cluster that typically does not include the user's local machine. This cloud can be made available in particular by the medical facility, which also provides the medical imaging systems. In particular, the image acquisition data is sent to a (remote) computer system (the "cloud") via a RIS (Radiology Information System) or a PACS (Picture Archiving and Communication System).

Within the scope of an exemplary embodiment of the system according to the disclosure, the (or at least some components of the system are present on the "cloud" side. A system according to an exemplary embodiment further comprises, a local computing unit connected to the system via a data channel (e.g. a data-network, particularly configured as RIS or PACS). The local computing unit includes at least one data receiving interface to receive data. Moreover, in an exemplary embodiment, the local computer additionally has a transmission interface in order to send data to the system.

In the diagrams, like numbers refer to like objects throughout. Objects in the diagrams are not necessarily drawn to scale.

Figure 1:
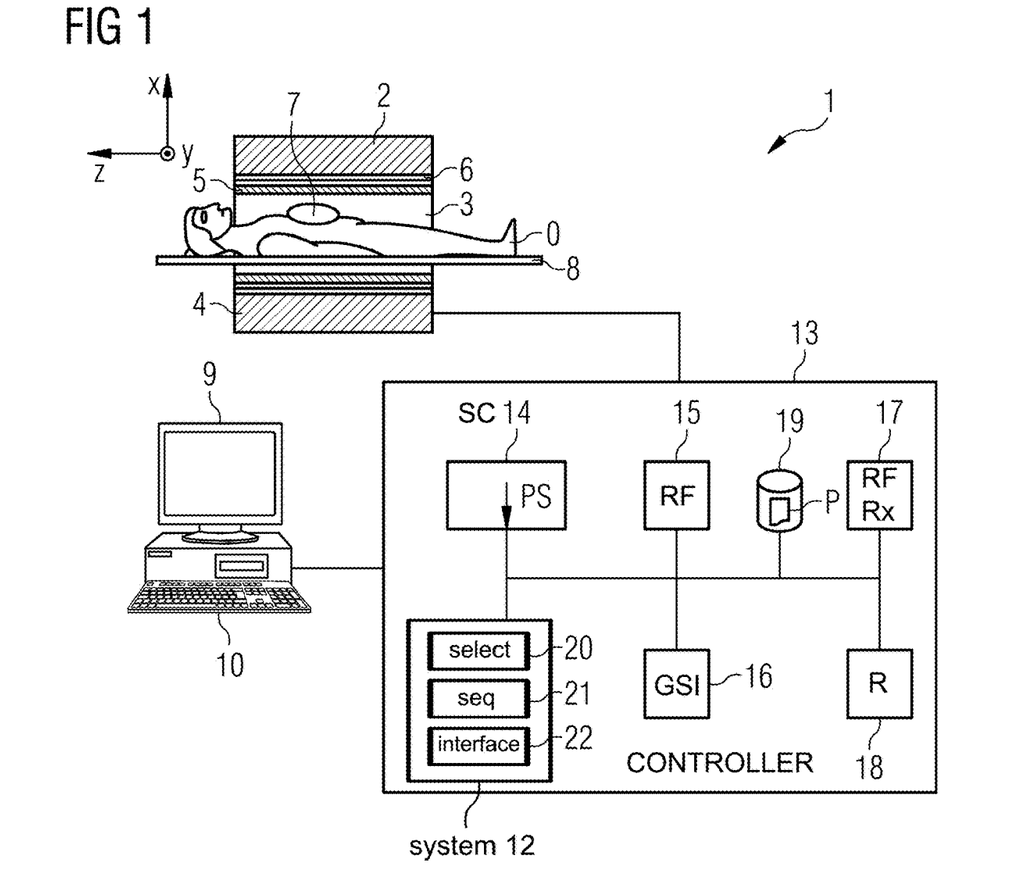
FIG. 1 shows a simplified MRI system according to an exemplary embodiment of the disclosure.

FIG. 1 shows a schematic representation of a magnetic resonance imaging system 1 ("MRI-system"). The MRI system 1 includes the magnetic resonance scanner (data acquisition unit) 2 with an examination space 3 or patient tunnel in which a patient or test person is positioned on a driven bed 8, in whose body the actual examination object is located.

The magnetic resonance scanner 2 is typically equipped with a main field magnet system 4, a gradient system 6 as well as an RF transmission antenna system 5 and an RF reception antenna system 7. In the shown exemplary embodiment, the RF transmission antenna system 5 is a whole-body coil permanently installed in the magnetic resonance scanner 2, in contrast to which the RF reception antenna system 7 is formed as local coils (symbolized here by only a single local coil) to be arranged on the patient or test subject. In principle, however, the whole-body coil can also be used as an RF reception antenna system, and the local coils can respectively be switched into different operating modes.

In an exemplary embodiment, the main field magnet system 4 is configured such that at least two slices can be recorded. It here is configured in a typical manner so that it generates a main magnetic field in the longitudinal direction of the patient, i.e. along the longitudinal axis of the magnetic resonance scanner 2 that proceeds in the z-direction. The gradient system 6 typically includes individually controllable gradient coils in order to be able to switch (activate) gradients in the x-direction, y-direction or z-direction independently of one another.

The MRI system 1 shown here is a whole-body system with a patient tunnel into which a patient can be completely introduced. However, in principle the disclosure can also be used at other MRI systems, for example with a laterally open, C-shaped housing, as well as in smaller magnetic resonance scanners in which only one body part can be positioned.

In an exemplary embodiment, the MRI system 1 has a central controller 13 that is configured to control the MRI system 1. In an exemplary embodiment, the controller 13 includes a sequence controller 14 for measurement sequence control. With this sequence controller 14, the series of radio-frequency pulses (RF pulses) and gradient pulses can be controlled depending on a selected pulse sequence PS or, respectively, a series of multiple pulse sequence PS to acquire magnetic resonance images of the slices within a measurement session. For example, such a series of pulse sequence PS can be predetermined within a measurement or control protocol P. Different control protocols P for different measurements or measurement sessions are typically stored in a memory 19 and can be selected by and operator (and possibly modified as necessary) and then be used to implement the measurement. In an exemplary embodiment, controller 13 (and/or one or more components of the controller 13) includes processing circuitry configured to perform one or more functions and/or operations of the controller 13 (and/or components therein), including controlling the MRI system 1 (and/or one or more components therein), processing magnetic resonance signals, reconstructing magnetic resonance images, processing input from the user of the MRI system 1 and/or providing an output to the user.

To output the individual RF pulses of a pulse sequence PS, the central controller 13 has a radio-frequency transmission device 15 that generates and amplifies the RF pulses and feeds them into the RF transmission antenna system 5 via a suitable interface (not shown in detail). To control the gradient coils of the gradient system 6, the controller 13 has a gradient system interface 16. The sequence controller 14 communicates in a suitable manner with the radio-frequency transmission device 15 and the gradient system interface 16 to emit the pulse sequence PS.

Moreover, the controller 13 has a radio-frequency receiver 17 (likewise communicating with the sequence controller 14 in a suitable manner) in order to acquire magnetic resonance signals (i.e. raw data) for the individual measurements, which magnetic resonance signals are received in a coordinated manner from the RF reception antenna system 7 within the scope of the pulse sequence PS.

A reconstructor 18 receives the acquired raw data and reconstructs magnetic resonance image data therefrom for the measurements. This reconstruction is typically performed on the basis of parameters that may be specified in the respective measurement or control protocol. For example, the image data can then be stored in a memory 19.

Operation of the central controller 13 can take place via a terminal 10 with an input unit and a display 9, via which the entire MRI system 1 can thus also be operated by an operator. MR images can also be displayed at the display 9, and measurements can be planned and started by means of the input (possibly in combination with the display 9), and in particular suitable control protocols can be selected (and possibly modified) with suitable series of pulse sequence PS as explained above.

In an exemplary embodiment, the controller 13 comprises a system 12 configured to perform the method according to the disclosure. In an exemplary embodiment, the system 12 comprises the following components that may appear to be software modules. In one or more embodiments, the modules may additionally or alternatively include processing circuitry configured to perform respect functions of the modules.

A selector 20 that is configured to select a number of MT-preparation modules M, M' and an acquisition scheme AS comprising a plurality of IR-imaging modules IR, S in an interleaved arrangement, wherein each IR-imaging module IR, S comprises an IR-preparation module IR and a slice acquisition module S (see also the following figures).

A sequencer 21 configured to generate a pulse sequence PS by arranging at least one MT-preparation module M, M' of the number of MT-preparation modules M, M' between two successive IR-preparation modules IR of the interleaved IR-imaging modules IR, S or in front of the first IR-preparation module IR of a group of interleaved IR-imaging modules IR, S.

The sequencer 21 may also be configured to include varied MT-preparation modules M, M' in the pulse sequence PS and/or to determine a combined MT-module from two initial MT-preparation modules M, M'.

A data interface 22 configured to send the pulse sequence PS to a memory device 19 or an application device 15.

The system 12 may also comprise the radio-frequency transmission device 15 for directly applying the pulse sequence PS in a magnetic resonance imaging system 1.

The MRI system 1 according to the disclosure, and in particular the controller 13, can have a number of additional components that are not shown in detail but are typically present at such systems, for example a network interface in order to connect the entire system with a network and be able to exchange raw data and/or image data or, respectively, parameter maps, but also additional data (for example patient-relevant data or control protocols).

The manner by which suitable raw data is acquired and MR images are reconstructed from the raw data, is known to those skilled in the art and thus need not be explained in detail herein.

Figure 2:
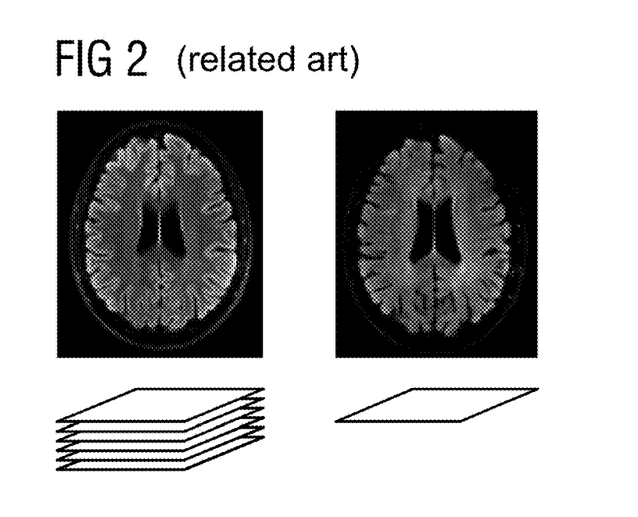
FIG. 2 shows conventional two fluid-attenuated, T2-weighted Turbo spin echo images.

FIG. 2 shows two fluid-attenuated (FLAIR), T2-weighted Turbo spin echo (TSE) images acquired with multiple slices (left) and a single slice only (right) according to the state of the art. These pictures demonstrate the relevance of Magnetization Transfer (MT) effects, wherein all other imaging parameters were kept identical. Compared to gray matter, white matter exhibits a considerable amount of bound water protons, mostly macromolecules within the myelin sheaths of axons. Saturation of the latter by the additional RF-pulses, and magnetization transfer between the water species yield additional attenuation of the white matter signal. In this T2-FLAIR example, the disclosure would enable the more advantageous ms-EPI acquisition to achieve contrast comparable to that of the established TSE technique.

Figure 3:
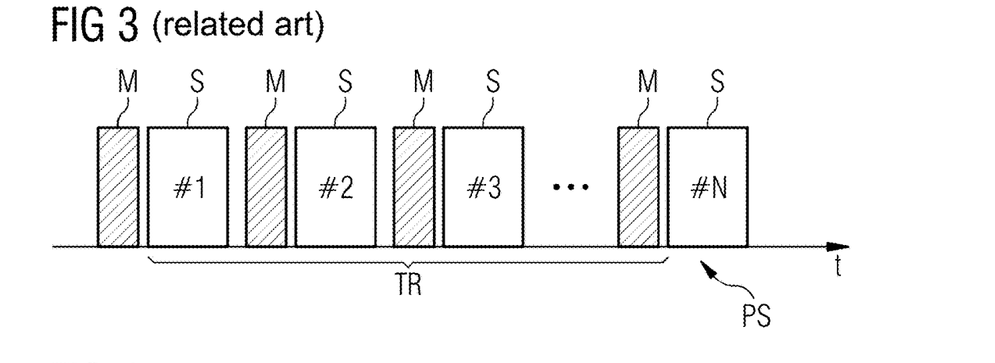
FIG. 3 shows a conventional pulse sequence for an MT-prepared acquisition.

FIG. 3 shows an example of a pulse sequence PS for an MT-prepared acquisition according to the prior art. It should be noted that the numbers (#1, #2, . . . , #N) refer to an acquisition order and not necessarily to any kind of anatomical slice order. In the state of the art, when MT-preparation modules M are required for a desired contrast and/or enabled by a user, they get applied immediately before each imaging module (slice acquisition module S). The MT-preparation is spatially non-selective and thus acts on the complete imaging volume. If multiple sub-volumes get successively acquired, each (spatially selective) acquisition is preceded by a (spatially non-selective) MT-preparation module M. After a short period of time, the magnetization evolution establishes a steady state which yields a similar contrast for all sub-volumes.

Figure 4:
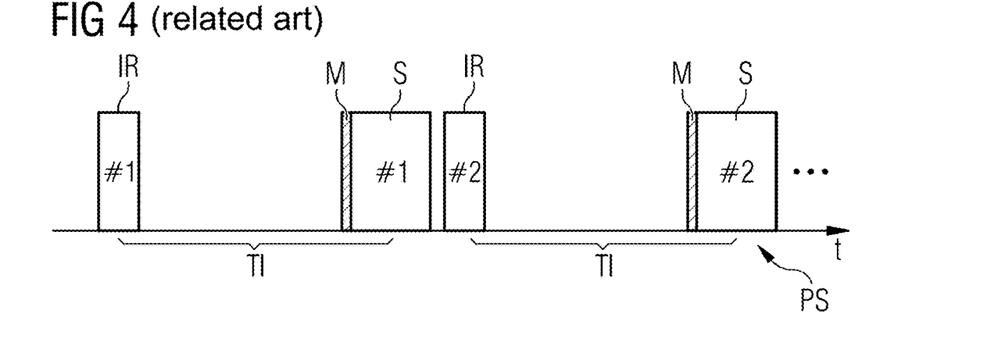
FIG. 4 shows a conventional pulse sequence incorporating IR-preparation into an already MT-prepared imaging acquisition.

FIG. 4 shows an example of a pulse sequence PS incorporating IR-preparation into an already MT-prepared imaging acquisition according to the prior art. Shown is a simple approach to attenuate the fluid signal by an IR-preparation module IR. However, given that a rather long inversion time TI is required to null the fluid signal, this scheme is very inefficient and would lead to extremely long acquisition times.

Figure 5:
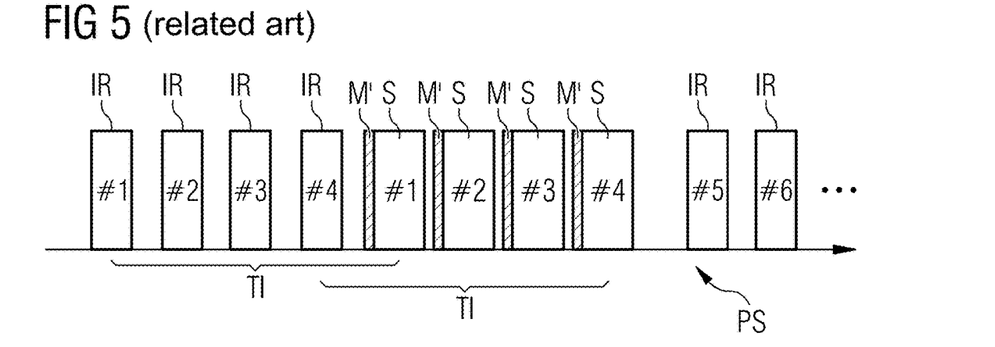
FIG. 5 shows a conventional pulse sequence incorporating IR-preparation into an already MT-prepared slice-interleaved imaging acquisition.

FIG. 5 shows an example of a pulse sequence PS incorporating IR-preparation into an already MT-prepared slice-interleaved imaging acquisition according to the prior art. Such interleaved acquisition schemes are usually used to apply a block of IR-preparations for multiple slices, followed by a block of MT-preparations and data sampling modules. While being very efficient regarding the measurement time, it turns out that the successive application of IR-preparations interrupts the impact of the (spatially non-selective) MT-preparation modules on the steady state. Thus, the first slice(s) of each block will exhibit a different (non-desirable) image contrast. While the following slices slowly reach steady state and have a more desirable image contrast (see also FIG. 8, top row).

Figure 6:
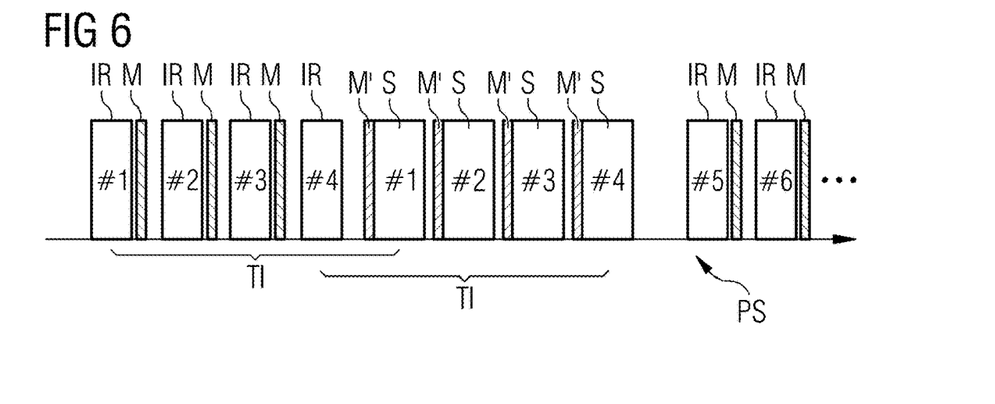
FIG. 6 shows a pulse sequence according to an exemplary embodiment of the disclosure.

FIG. 6 shows an example of a pulse sequence PS according to an embodiment of the disclosure. Shown is a pulse sequence PS for a fast, interleaved data acquisition while a MT-related steady state is maintained. This is achieved by adding MT-preparation modules M into the "IR-block" of the IR-preparation modules IR. By trying to keep the time interval between successive MT-preparation modules M, M' similar throughout the scan, all data gets sampled with a comparable amount of MT-contrast. Compared to FIG. 5, additional MT-preparation modules get applied between successive IR-preparation modules IR. If the duration of an IR-preparation module IR is shorter than the duration of the slice acquisition module S, the gap between two IR-preparations will be sufficiently long to allow the application of a MT-preparation.

Figure 7:
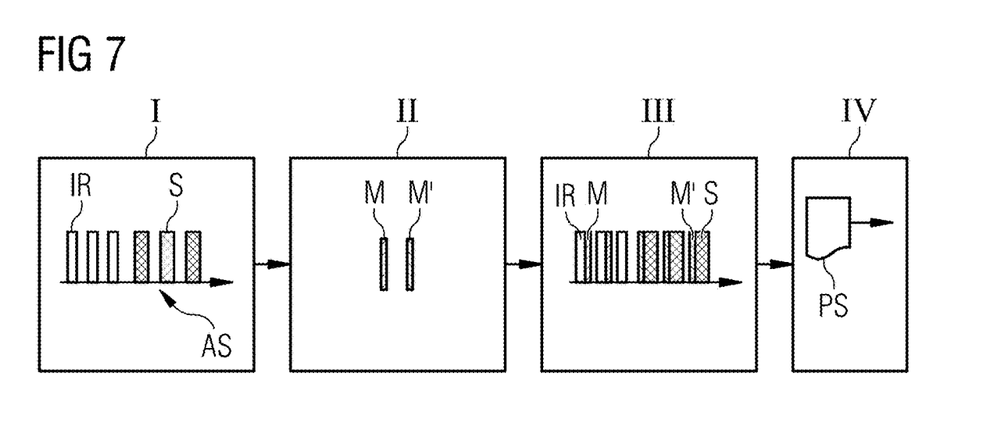
FIG. 7 shows a flowchart of a method according to an exemplary embodiment of the disclosure.

FIG. 7 shows a block diagram of the process flow of a method according to an exemplary embodiment of the disclosure for improving the contrast of magnetization-transfer-prepared MRI (e.g. for generating a pulse sequence PS as shown in FIG. 6.

In step I, an acquisition scheme AS is selected, comprising a plurality of IR-imaging modules IR, S in an interleaved arrangement, wherein each IR-imaging module IR, S comprises an IR-preparation module IR and a slice acquisition module S.

In step II, a number of MT-preparation modules M, M' is selected.

In step III, a pulse sequence PS is generated by arranging at least one MT-preparation module M, M' of the number of MT-preparation modules M, M' between two successive IR-preparation modules IR of the interleaved IR-imaging modules IR, S or in front of the first IR-preparation module IR of a group of interleaved IR-imaging modules IR, S.

Shown is an example of a slice-interleaved imaging acquisition procedure with multiple MT-preparation modules M, M' between IR-preparation modules IR and between slice acquisition modules S.

In step IV, this pulse sequence PS is applied or saved for an MRI examination.

In FIGS. 6 and 7, there could be used identical or varying MT-preparation modules M, M'. Also combined MT-modules (a combination of two or more overlapping initial MT-preparation modules M, M') could be used in the pulse sequence PS.

Figure 8:
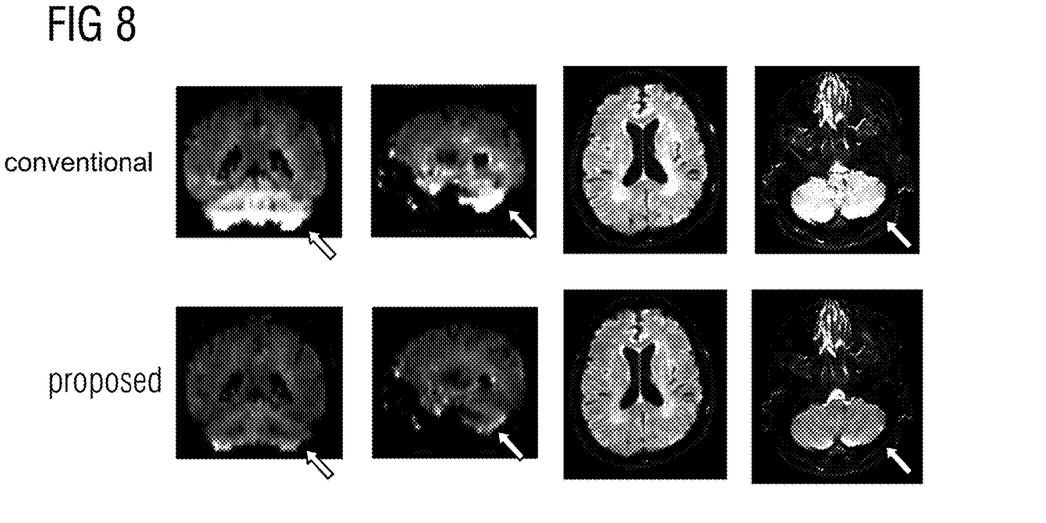
FIG. 8 shows differences between conventional images and images obtained according to aspects the disclosure.

FIG. 8 shows differences between images of the prior art (top) and the present disclosure (bottom). The first two images (left) show a coronal cut (left) and sagittal cut (middle left) through a series of slices which have been acquired with axial orientation from the lower part of the brain to the upper part. The second two images (right) show (axial) slices in the middle (middle right) and at the beginning (right) of a sampling block. Arrows in the figures indicate regions of differences between the images of the prior art and of the disclosure.

Concerning the first two images (left), it is obvious that the first slices which have been acquired exhibit a suboptimal T2-FLAIR contrast (see arrows in the top row). Compared to the state of the art (top), the T2-FLAIR contrast in the images generated by the proposed scheme (bottom) is clearly more homogenous across all slices (see arrows in the pictures on the bottom left). Thus, comparing the coronal and sagittal views of the T2-FLAIR image volume acquired with the proposed imaging scheme and state of the art imaging scheme, the proposed method leads to better and more consistent contrast than the prior art, at least in the indicated regions.

The second images (right), show slices acquired with the proposed interleaving scheme (bottom) and prior art interleaving scheme (top). There is a clear difference of contrast shown for a slice in the center of the brain (middle right) and a slice in the cerebellum (right).

The "middle" slice (middle right) has been acquired in the middle of the sampling block, and both images (prior art and proposed method) exhibit the desired T2-FLAIR contrast. However, the cerebellum on the right has been acquired at the beginning of the sampling block: while the proposed sampling scheme (bottom) ensures a proper MT-related steady state and generates the desired contrast, the prior art (top) shows significantly deviating contrast properties.

Although the present disclosure has been disclosed in the form of exemplary embodiments and variations thereon, it will be understood that numerous additional modifications and variations could be made thereto without departing from the scope of the disclosure. For the sake of clarity, it is to be understood that the use of "a" or "an" throughout this application does not exclude a plurality, and "comprising" does not exclude other steps or elements. The expression "a number of" means "at least one". The mention of a "unit" or a "device" does not preclude the use of more than one unit or device. The expression "a number of" has to be understood as "at least one".

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for improving the contrast of magnetization-transfer-prepared magnetic resonance imaging (MRI) comprising:
    selecting an acquisition scheme comprising a plurality of inversion-recovery (IR)-imaging modules in an interleaved arrangement, wherein each IR-imaging module comprises an IR-preparation module and a slice acquisition module;
    selecting a number of magnetization-transfer (MT)-preparation modules;
    generating a pulse sequence by arranging at least one MT-preparation module of the number of MT-preparation modules between two successive IR-preparation modules of the interleaved IR-imaging modules or in front of the first IR-preparation module of a group of interleaved IR-imaging modules; and
    applying or saving the pulse sequence for an MRI examination.

2. The method according to claim 1, wherein at least one MT-preparation module of the number of MT-preparation modules is arranged between and/or in front of the successive IR-preparation modules of interleaved IR-imaging modules such that there is a block of multiple alternating IR-preparation modules and MT-preparation modules.

3. The method according to claim 2, wherein the block comprises at least two IR-preparation modules.

4. The method according to claim 1, wherein the IR-imaging modules are arranged in a form of a slice-interleaved imaging acquisition procedure, wherein MT-preparation modules are arranged in front of slice acquisition modules of the plurality of IR-imaging modules.

5. The method according to claim 1, wherein properties of the MT-preparation modules arranged in the pulse sequence are varied with respect to an amplitude and/or a frequency offset.

6. The method according to claim 5, wherein a specific variation pattern of the MT-preparation modules used for slice acquisition modules is also used for IR-preparation modules.

7. The method according to claim 5, wherein a specific variation pattern of MT-preparation modules in an IR-imaging module is also used in another IR-imaging module in the pulse sequence.

8. The method according to claim 5, wherein the amplitude of MT-preparation-modules is reduced towards an end of a block of interleaved slice acquisition modules, wherein the number of MT-preparation modules with reduced amplitude is specified by a user, determined heuristically, or calculated based on a time constant of the decay of desired MT-related contrast.

9. The method according to claim 8, wherein the amplitude of MT-preparation-modules is reduced based on a continuous linear or exponential reduction or based on a fixed, step-function reduction.

10. The method according to claim 5, further comprising adapting amplitudes of MT-preparation modules between the IR-preparation modules to obtain a steady state of MT-related contrast properties, wherein amplitudes of MT-preparation modules are automatically calculated based on assumptions about relaxation times, fractional spin pool sizes, and/or exchange rates of two spin pools.

11. The method according to claim 1, wherein at least two succeeding MT-preparation modules are arranged in front of an IR-preparation module, the method further comprising:
    selecting two initial MT-preparation modules; and
    determining a combined MT-module from the two MT-preparation modules, by choosing a time-offset including a relative application time-shift and a phase-shift between the two MT-preparation modules, wherein this time-offset is chosen such that the two MT-preparation modules overlap, including the combined MT-module in the pulse sequence.

12. A computer-program product, embodied on a non-transitory computer-readable storage medium, having instructions which, when the program is executed by a computer, cause the computer to carry out the steps of the method of claim 1.

13. A non-transitory computer-readable storage medium comprising instructions which, when executed by a computer, cause the computer to carry out the steps of the method of claim 1.

14. A system for controlling a magnetic resonance imaging system, comprising:
    a selector configured to select a number of magnetization-transfer (MT)-preparation modules and an acquisition scheme comprising a plurality of inversion-recovery (IR)-imaging modules in an interleaved arrangement, wherein each IR-imaging module comprises an IR-preparation module and a slice acquisition module;

a sequencer configured to generate a pulse sequence by arranging at least one MT-preparation module of the number of MT-preparation modules between two successive IR-preparation modules of the interleaved IR-imaging modules or in front of the first IR-preparation module of a group of interleaved IR-imaging modules;

a data interface configured to send the pulse sequence to a memory device or an application device; and a radio-frequency transmitter configured to apply the pulse sequence in a magnetic resonance imaging system.

15. The system according to claim 14, wherein the sequencer is configured to:

include varied MT-preparation modules in the pulse sequence, wherein properties of the MT-preparation modules arranged in the pulse sequence are varied with respect to an amplitude and/or a frequency offset; and/or determine a combined MT-module, wherein at least two succeeding MT-preparation modules are arranged in front of an IR-preparation module, determining the combined MT-module including:

selecting two initial MT-preparation modules; and determining a combined MT-module from the two MT-preparation modules, by choosing a time-offset including a relative application time-shift and a phase-shift between the two MT-preparation modules, wherein this time-offset is chosen such that the two MT-preparation modules overlap, including the combined MT-module in the pulse sequence.

16. A controller for controlling a magnetic resonance imaging system comprising:

a selector configured to select a number of magnetization-transfer (MT)-preparation modules and an acquisition scheme comprising a plurality of inversion-recovery (IR)-imaging modules in an interleaved arrangement, wherein each IR-imaging module comprises an IR-preparation module and a slice acquisition module;

a sequencer configured to generate a pulse sequence by arranging at least one MT-preparation module of the number of MT-preparation modules between two successive IR-preparation modules of the interleaved IR-imaging modules or in front of the first IR-preparation module of a group of interleaved IR-imaging modules;

a data interface configured to send the pulse sequence to a memory device or an application device; and a radio-frequency transmitter configured to apply the pulse sequence in a magnetic resonance imaging system.

17. A magnetic resonance imaging system comprising a controller according to claim 16.

* * * * *